(12) United States Patent
Sim et al.

(10) Patent No.: US 7,541,241 B2
(45) Date of Patent: Jun. 2, 2009

(54) METHOD FOR FABRICATING MEMORY CELL

(75) Inventors: Jai Hoon Sim, Hsinchu (TW); Jih Wen Chou, Hsinchu (TW)

(73) Assignee: Promos Technologies, Inc., Hsinchu (TW)

( * ) Notice: Subject to any disclaimer, the term of this patent is extended or adjusted under 35 U.S.C. 154(b) by 191 days.

(21) Appl. No.: 11/298,836

(22) Filed: Dec. 12, 2005

(65) Prior Publication Data

US 2007/0131982 A1 Jun. 14, 2007

(51) Int. Cl.
*H01L 21/336* (2006.01)

(52) U.S. Cl. .................. 438/259; 438/270; 438/300; 438/304; 438/596

(58) Field of Classification Search ............ 438/296, 438/596, 259, 270, 300, 304; 257/316
See application file for complete search history.

(56) References Cited

U.S. PATENT DOCUMENTS

| 6,869,849 | B2 * | 3/2005 | Kanamori ............... 438/296 |
| 7,045,852 | B2 * | 5/2006 | Van Duuren et al. ...... 257/316 |
| 2005/0224860 | A1 * | 10/2005 | Hendriks et al. .......... 257/315 |

* cited by examiner

*Primary Examiner*—Thanh Nguyen
(74) *Attorney, Agent, or Firm*—Oliff & Berridge, PLC (57) ABSTRACT

A memory cell structure comprises a semiconductor substrate, two stack structures positioned on the semiconductor substrate, two conductive spacers positioned on sidewalls of the two stack structures, a gate oxide layer covering a portion of the semiconductor substrate between the two conductive spacers and a gate structure positioned at least on the gate oxide layer. Particularly, each of two stack structures includes a first oxide block, a conductive block and a second oxide block, and the two conductive spacers are positioned at on the sidewall of the two conductive blocks of the two stack structures. The two conductive spacers are preferably made of polysilicon, and have a top end lower than the bottom surface of the second oxide block. In addition, a dielectric spacer is positioned on each of the two conductive spacers.

9 Claims, 8 Drawing Sheets

METHOD FOR FABRICATING MEMORY CELL

BACKGROUND OF THE INVENTION (A) Field of the Invention

The present invention relates to a memory cell structure and method for fabricating the same, and more particularly, to memory cell structure having a transistor with source and drain positioned on a semiconductor substrate and the method for fabricating the same.

(B) Description of the Related Art

Figure 1:
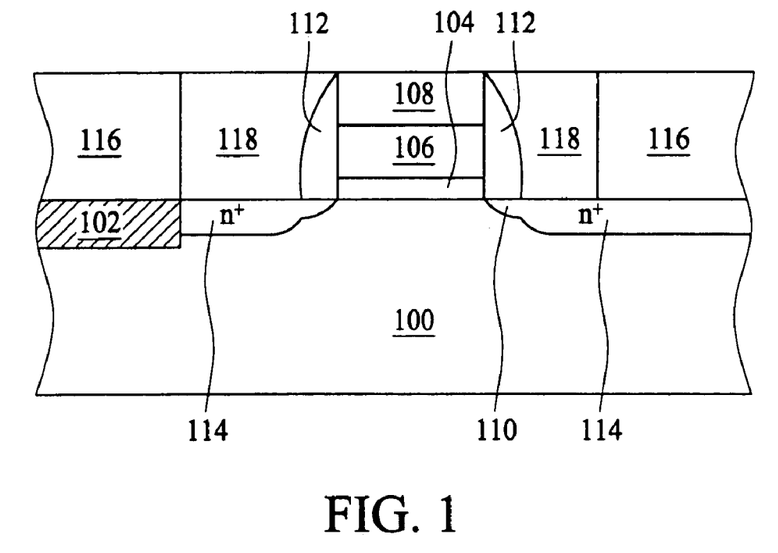
FIG. 1 illustrates a semiconductor transistor structure according to a prior art.
Figure 2:
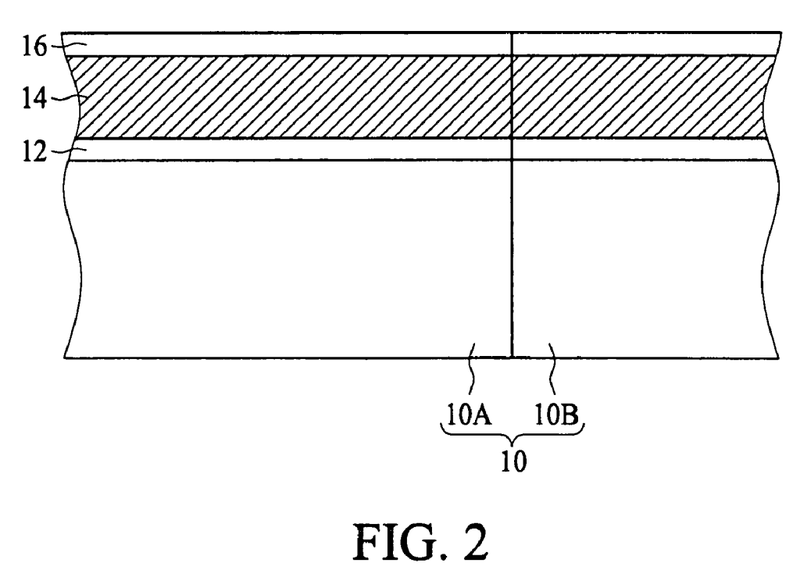
FIG. 2 to FIG. 7 illustrate a method for fabricating a memory cell structure according to one embodiment of the present invention.

FIG. 1 illustrates a semiconductor transistor structure according to a prior art. The semiconductor transistor structure comprises a gate structure positioned on a semiconductor substrate 100, which has an isolation device 102 to isolate the transistors on the semiconductor substrate 100. The gate structure comprises a gate oxide layer 104 positioned on the semiconductor substrate 104, a polysilicon gate 106 positioned on the gate oxide layer 104, and a nitride layer 108 positioned on the polysilicon gate 106. Spacers 112 are positioned on the sidewalls of the gate structure. Lightly doped drain (LDD) regions 110 are positioned in the semiconductor substrate 100, and a source/drain 114 is positioned in the semiconductor substrate 100 and nearby in the LDD regions 110. In addition, the semiconductor transistor structure further comprises an oxide layer 116 positioned on the semiconductor substrate 100, and contacts 118 in the oxide layer 116.

As semiconductor transistor structures become smaller, the conventional dynamic random access memory structure can no longer meet the requirements of junction leakage current and subthreshold leakage current. Although the subthreshold leakage current can be reduced by increasing the channel doping concentration up to $4 \times 10^{18}$ cm$^{-3}$, the junction leakage current will increase dramatically as a result of tunneling current between band to band.

SUMMARY OF THE INVENTION

The objective of the present invention is to provide a memory cell structure having conductive polysilicon blocks serving as source and drain, which are positioned on a semiconductor substrate rather than in the semiconductor substrate and electrically connected to a carrier channel in the semiconductor substrate via conductive spacers on sidewalls of the conductive polysilicon blocks to avoid the junction leakage current and the short channel effect.

In order to achieve the above-mentioned objective and avoid the problems of the prior art, one embodiment of the present invention discloses a memory cell structure comprising a semiconductor substrate, two stack structures positioned on the semiconductor substrate, two conductive spacers positioned on sidewalls of the two stack structures, a gate oxide layer covering a portion of the semiconductor substrate between the two conductive spacers on the sidewalls of the two stack structures and a gate structure positioned at least on the gate oxide layer. Particularly, each of the stack structures includes a first oxide block, a conductive block made of doped polysilicon and a second oxide block.

The conductive spacers on the sidewalls of the two stack structures are preferably made of polysilicon, and have a top end even with or lower than the bottom surface of the second oxide block. In addition, the conductive spacers could be an L-shaped profile, while a dielectric spacer is further positioned on the corner of the L-shaped conductive spacer, and the gate oxide layer is formed at least on the exposed conductive spacers and the exposed semiconductor substrate uncovered by the dielectric spacer. Further, the semiconductor substrate preferably has a recess between the conductive spacers on the sidewalls of the two stack structures, and the gate oxide layer covers the surface of the semiconductor substrate in the recess.

The method for fabricating a memory cell structure comprises steps of forming two stack structures separated by an opening, and each of the two stack structure has a first oxide block, a conductive block and a second oxide block on a semiconductor substrate, forming two conductive spacers on sidewalls of the two stack structures, forming a gate oxide layer covering a portion of the semiconductor substrate between the two conductive spacers on the sidewalls of the two stack structures and forming a gate structure positioned at least on the gate oxide layer. Preferably, the conductive spacers are prepared by depositing a polysilicon layer on the semiconductor substrate and performing an anisotropic etching process to remove a portion of the polysilicon layer. In addition, the conductive spacers can be prepared by depositing a polysilicon layer on the semiconductor substrate, forming a dielectric spacer on a predetermined surface of the polysilicon layer, and removing a portion of the exposed polysilicon layer uncovered by the dielectric spacer to form the conductive spacers having an L-shaped profile.

BRIEF DESCRIPTION OF THE DRAWINGS

The objectives and advantages of the present invention will become apparent upon reading the following description and upon reference to the accompanying drawings in which.

DETAILED DESCRIPTION OF THE INVENTION

FIG. 2 to FIG. 7 illustrate a method for fabricating a memory cell structure 50 according to one embodiment of the present invention. A first oxide layer 12 is formed on a semiconductor substrate 10 such as a silicon substrate having a cell region 10A and a peripheral region 10B, a doped polysilicon layer 14 is then formed on the first oxide layer 12, and a second oxide layer 16 is formed on the doped polysilicon layer 14. Subsequently, a first photoresist layer (not shown in the drawing) is formed on the second oxide layer 16, and an etching process is performed to remove a portion of the second oxide layer 16, the doped polysilicon layer 14 and the first oxide layer 12 in the peripheral region 10B down to the surface of the semiconductor substrate 10.

Figure 3:
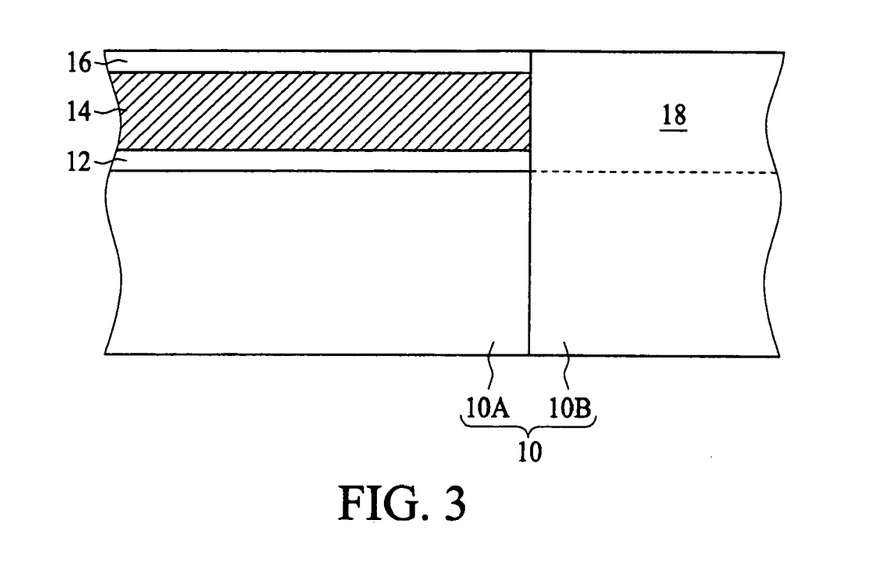

Referring to FIG. 3, a silicon layer 18 is then formed on the semiconductor substrate 10 in the peripheral region 10B by an epitaxy process, and the upper surface of the silicon layer 18 in the peripheral region 10B is aligned with or slightly lower than the surface of the second oxide layer 16 in the cell region 10A.

Figure 4:
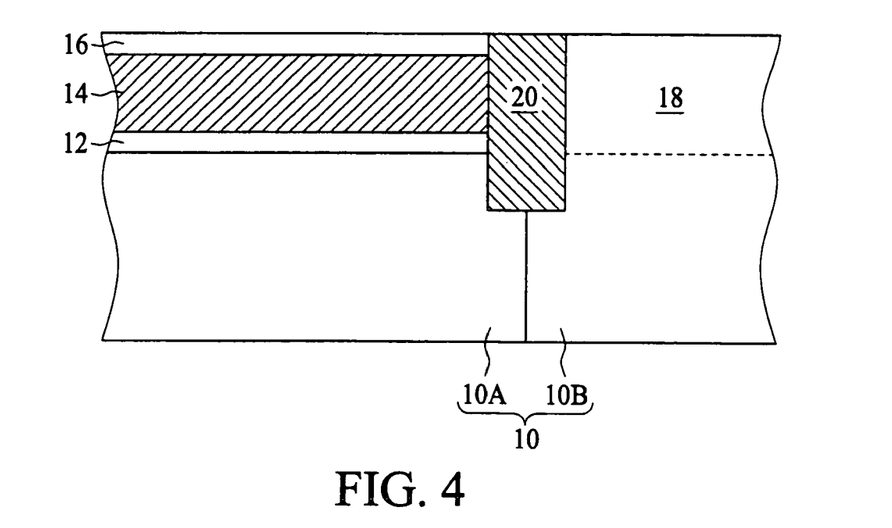

Referring to FIG. 4, a third photoresist layer having shallow trench isolation patterns (not shown in the drawing) is formed on the semiconductor substrate 10, and an etching process is then performed to form a first opening (not shown in the drawing) between the cell region 10A and peripheral region 10B by removing a portion of the second oxide layer 16, the doped polysilicon layer 14 and the first oxide layer 12 in the cell region 10A, a portion of the silicon layer 18 in the peripheral region 10B and a portion of the semiconductor substrate 10. Subsequently, the first opening is filled with silicon oxide to form a shallow trench isolation structure 20, which is used as an isolation device for the memory structure.

Figure 5:
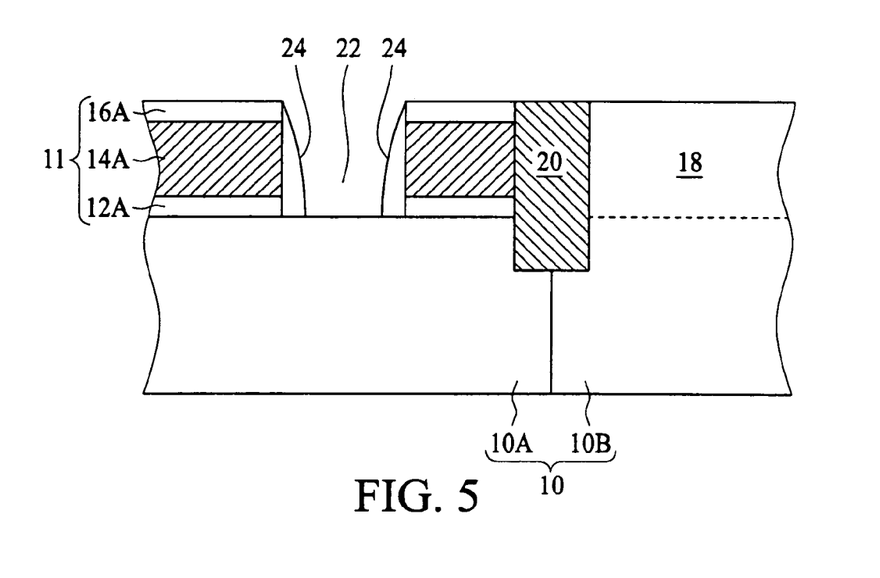

Referring to FIG. 5, a fourth photoresist layer (not shown in the drawing) is formed in the cell region 10A, and an etching process is then performed to form a second opening 22 by removing a portion of the second oxide layer 16, the doped polysilicon layer 14 and the first oxide layer 12 so as to form two stack structures 11 each including a first oxide block 12A, a conductive block 14A and a second oxide block 16A. The second opening 22 separates the two stack structures 11 and exposes a portion of the semiconductor substrate 10 and the sidewalls of the two stack structures 11. Subsequently, a polysilicon layer is formed in the second opening 22 by deposition process, and an anisotropic etching process is performed to remove a portion of the polysilicon layer to form two polysilicon spacers 24 on the sidewalls of the two stack structures 11.

Figure 6:
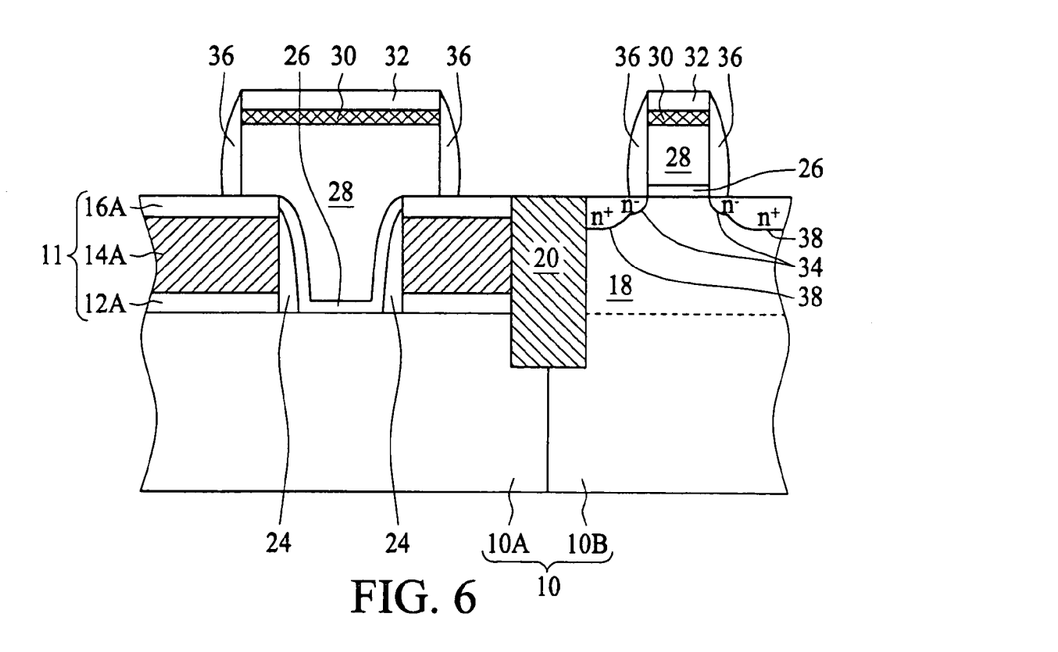

Referring to FIG. 6, a thermal oxidation process is performed to form a gate oxide layer 26 on the exposed surface of the semiconductor substrate 10 between the two polysilicon spacers 24 and on the surface of the polysilicon spacers 24 in the cell region 10A and on the surface of the silicon layer 18 in the peripheral region 10B. Particularly, the gate oxide layer 26 in the second opening 22 in the cell region 10A covers the two polysilicon spacers 24 and the semiconductor substrate 10 between the two polysilicon spacers 24. A polysilicon layer 28 is then formed on the gate oxide layer 26 and on the second oxide block 16A, and a nitride layer 30 and a third oxide layer 32 are formed on the polysilicon layer 28 in sequence.

Subsequently, a fifth photoresist layer having a first gate pattern and a second gate pattern (not shown in the drawing) is formed on the third oxide layer 32, and an etching process is then performed to form a first gate structure in the cell region 10A and a second gate structure in the peripheral region 10B. Particularly, the first gate structure is formed by etching the third oxide layer 32, the first nitride layer 30 and the polysilicon layer 28, and using the second oxide block 16A as an etch stop layer; the second gate structure in the peripheral region 10B is formed by etching the third oxide layer 32, the first nitride layer 30 and the polysilicon layer 28, and using the gate oxide layer 26 as an etch stop layer.

Figure 7:
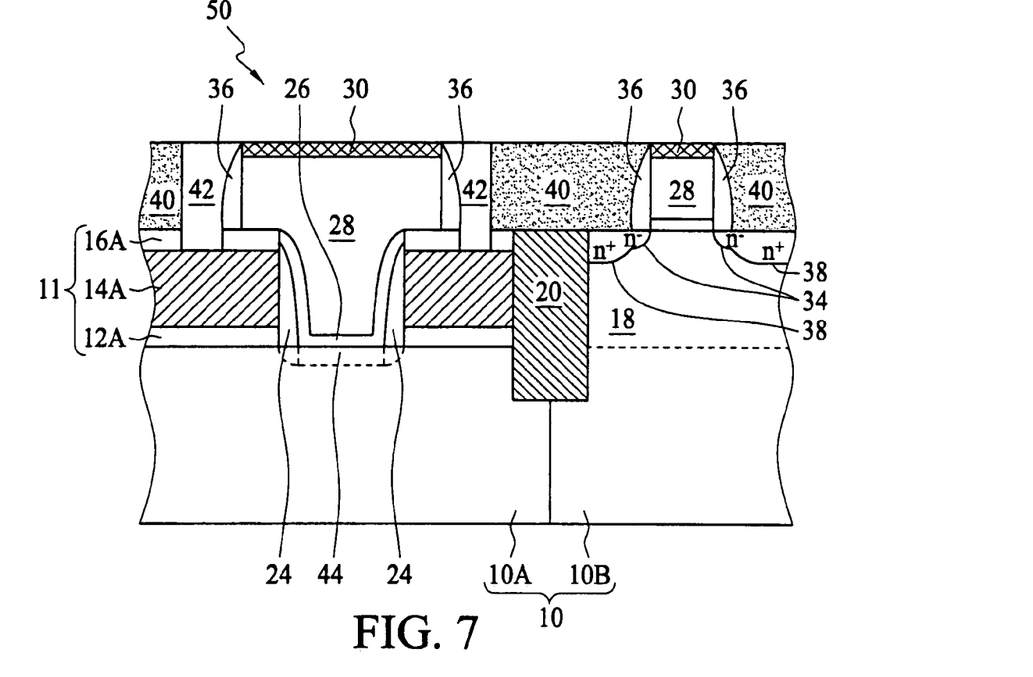

The second gate structure is used as a mask, and ions are implanted into the semiconductor substrate 10 in the peripheral region 10B to form LDD regions 34. Subsequently, a second nitride layer is formed on the semiconductor substrate 10, and an etching process is then performed to remove a portion of the second nitride layer to form two nitride spacers 36 on sidewalls of the first gate structure and the second gate structure. Ions are then implanted into the semiconductor substrate 10 in the peripheral region 10B to form source/drain regions 38 nearby the LDD regions 34. As shown in FIG. 7, a dielectric layer 40 is formed on the semiconductor substrate 10, and contact structure 42 is formed in the dielectric layer 40 near the first gate structure to electrically connect the conductive block 14A serving as a source and a drain to devices subsequently formed in an upper layer.

Figure 8:
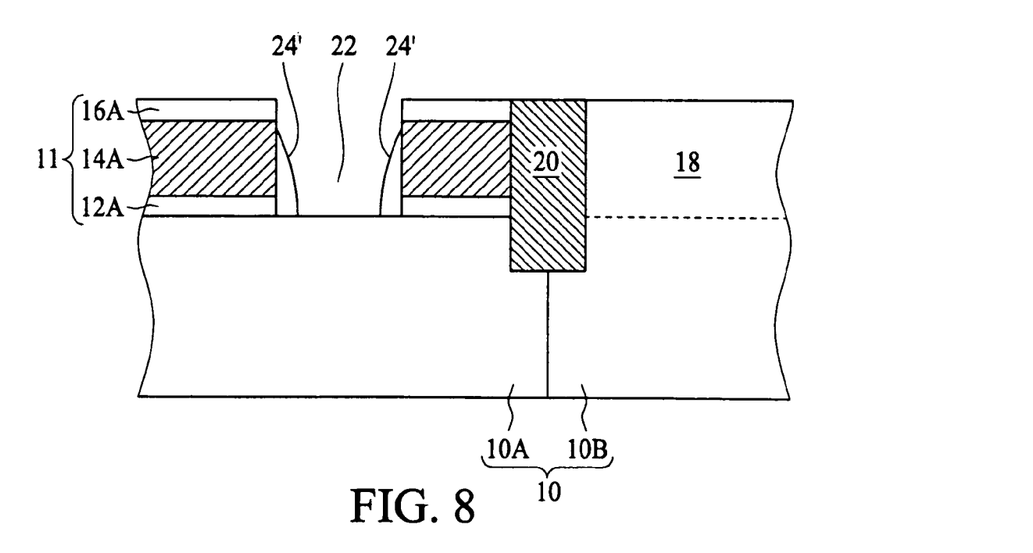
FIG. 8 to FIG. 9 illustrate a method for fabricating a memory cell structure according to another embodiment of the present invention.
Figure 9:
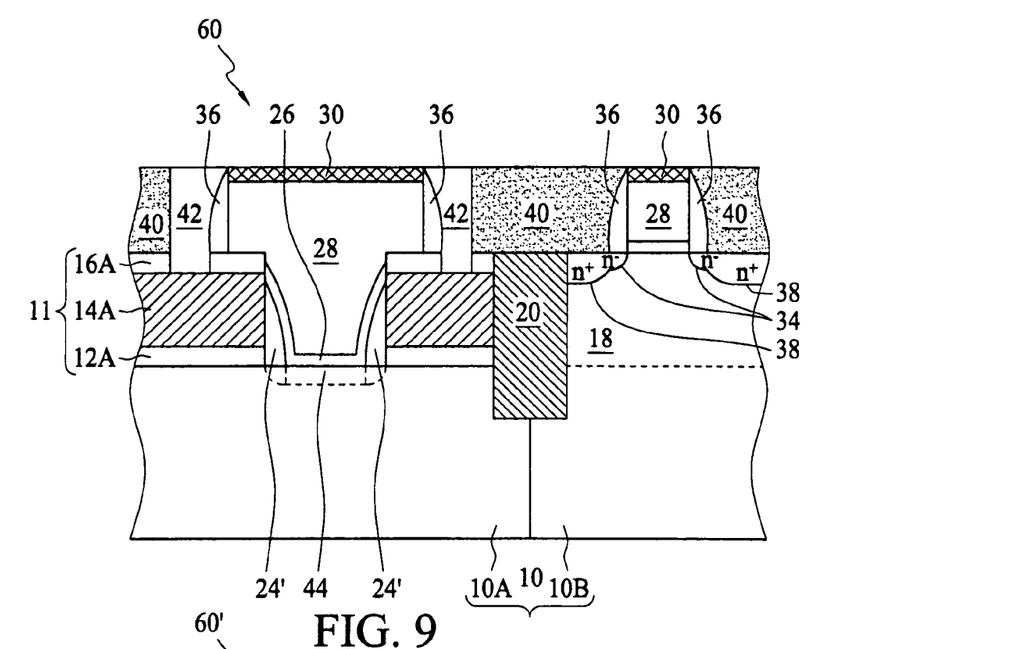

FIG. 8 and FIG. 9 illustrate a method for fabricating a memory cell structure 60 according to another embodiment of the present invention. Compared to the fabrication process of the memory cell structure 40 (as shown in FIG. 5) forming the two polysilicon spacers 24 on the sidewalls of the two stack structures 11, the fabrication process of the memory cell structure 60 (as shown in FIGS. 8 and 9) also forms the two polysilicon spacers 24' on the sidewalls of the two stack structures 11 but increases the etching time of the etch process so that the top end of the two polysilicon spacers 24' is lower than the bottom surface of the second oxide block 16A, as shown in FIG. 8. Preferably, the top end of the two polysilicon spacers 24' is even with or lower than the bottom surface of the second oxide block 16A to prevent short circuit between the two polysilicon spacers 24' and the polysilicon layer 28. Subsequently, the same fabricating processes shown in FIG. 6 and FIG. 7 are performed to complete the memory cell structure 60, as shown in FIG. 9.

Figure 10:
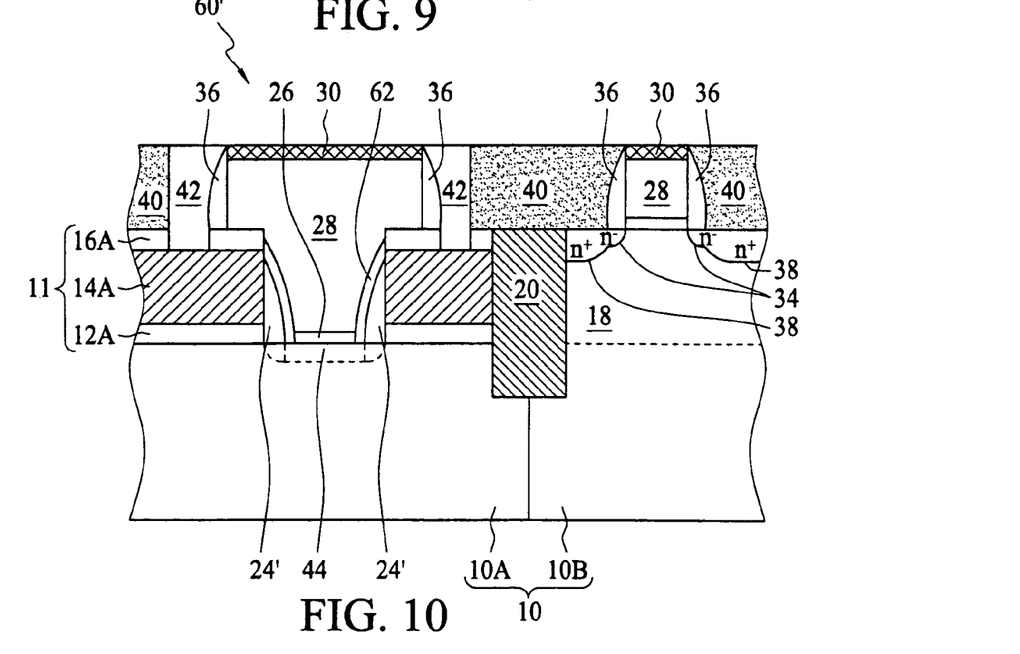
FIG. 10 illustrates a method for fabricating a memory cell structure according to another embodiment of the present invention.

FIG. 10 illustrate a method for fabricating a memory cell structure 60' according to another embodiment of the present invention. Compared to the fabrication process shown in the FIGS. 8 and 9, two dielectric spacers 62 are formed on the polysilicon spacers 24' before the gate oxide layer 26 is formed so as to enhance the insulation between the polysilicon spacers 24' and the polysilicon layer 28, as shown in FIG. 10. Preferably, the dielectric spacers 62 is formed in the second opening 22 by deposition a dielectric layer and an anisotropic etching process is performed to remove a portion of the dielectric layer to form the dielectric spacers 62 covering the surfaces of the two polysilicon spacers 24'.

Figure 11:
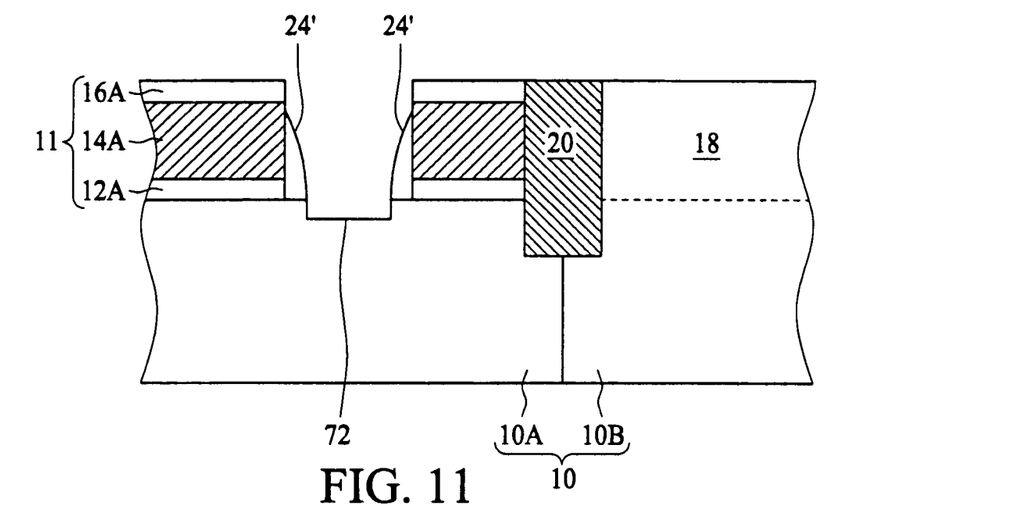
FIG. 11 and FIG. 12 illustrate a method for fabricating a memory cell structure according to another embodiment of the present invention.
Figure 12:
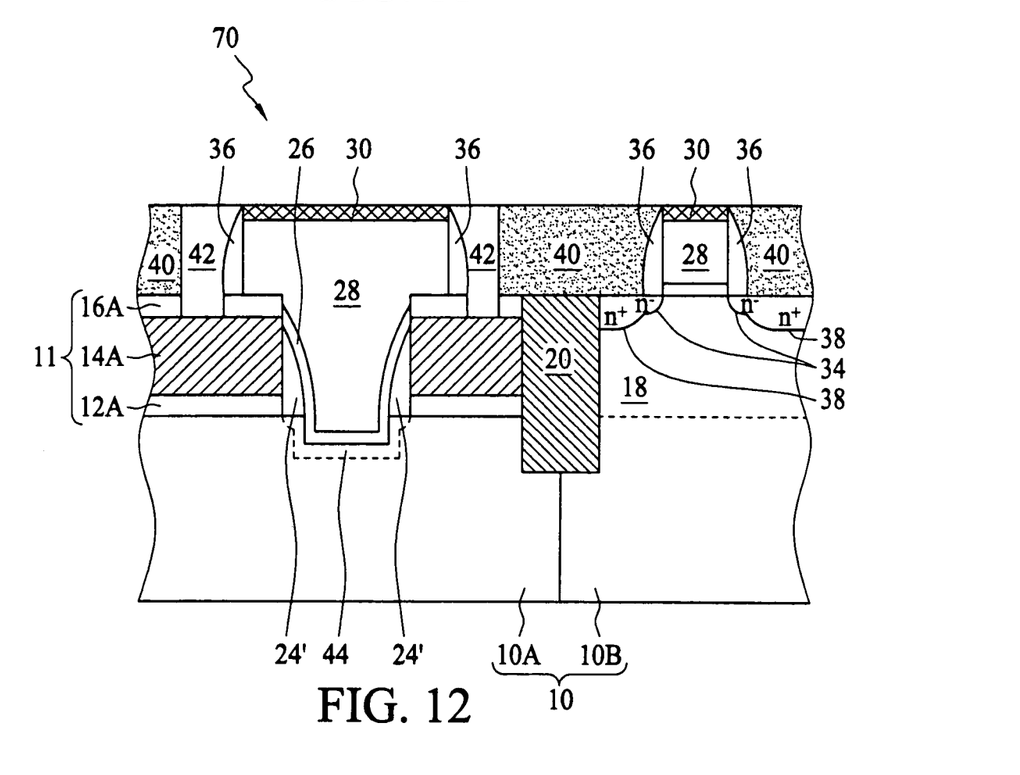

FIG. 11 and FIG. 12 illustrate a method for fabricating a memory cell structure 70 according to another embodiment of the present invention. After the two polysilicon spacers 24' are formed on the sidewalls of the two stack structure 11 as shown in FIG. 8, an etching process is performed to etch a portion of the semiconductor substrate 10 between the two polysilicon spacers 24' to form a recess 72 in the semiconductor substrate 10, and the gate oxide layer 26 is then formed on the surface of the recess 72 in the semiconductor substrate 10 and on the polysilicon spacers 24' in the cell region 10A and on the surface of the silicon layer 18 in the peripheral region 10B. Subsequently, the same fabricating processes shown in FIG. 6 and FIG. 7 are performed to complete the memory cell structure 70, as shown in FIG. 12. Particularly, the total length of the channel 44 consists of not only the lateral width of the recess 72 but also the vertical depth of the recess 72. As a result, the transistor in the memory cell structure 70 possesses a longer channel length.

Figure 13:
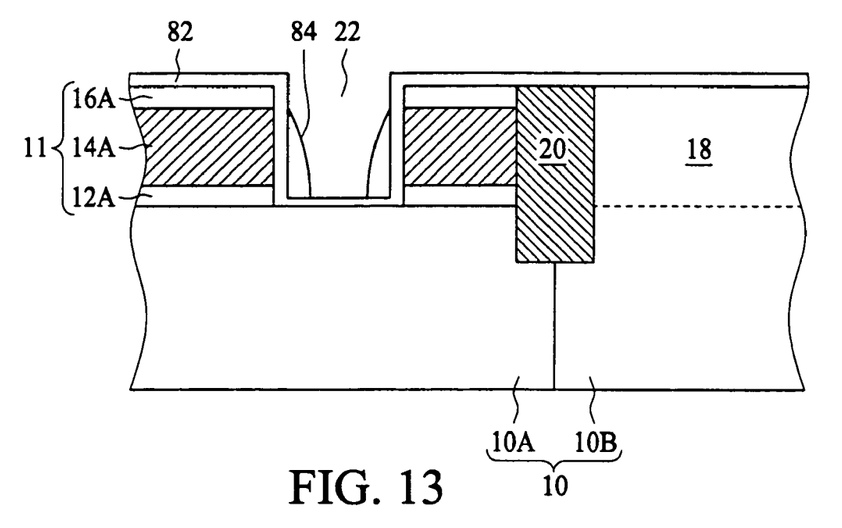
FIG. 13 to FIG. 15 illustrate a method for fabricating a memory cell structure according to another embodiment of the present invention.
Figure 14:
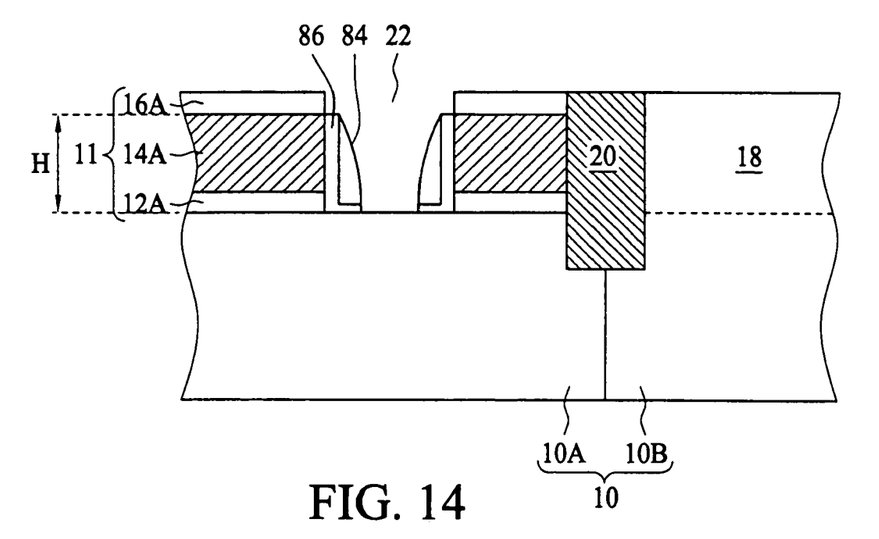
Figure 15:
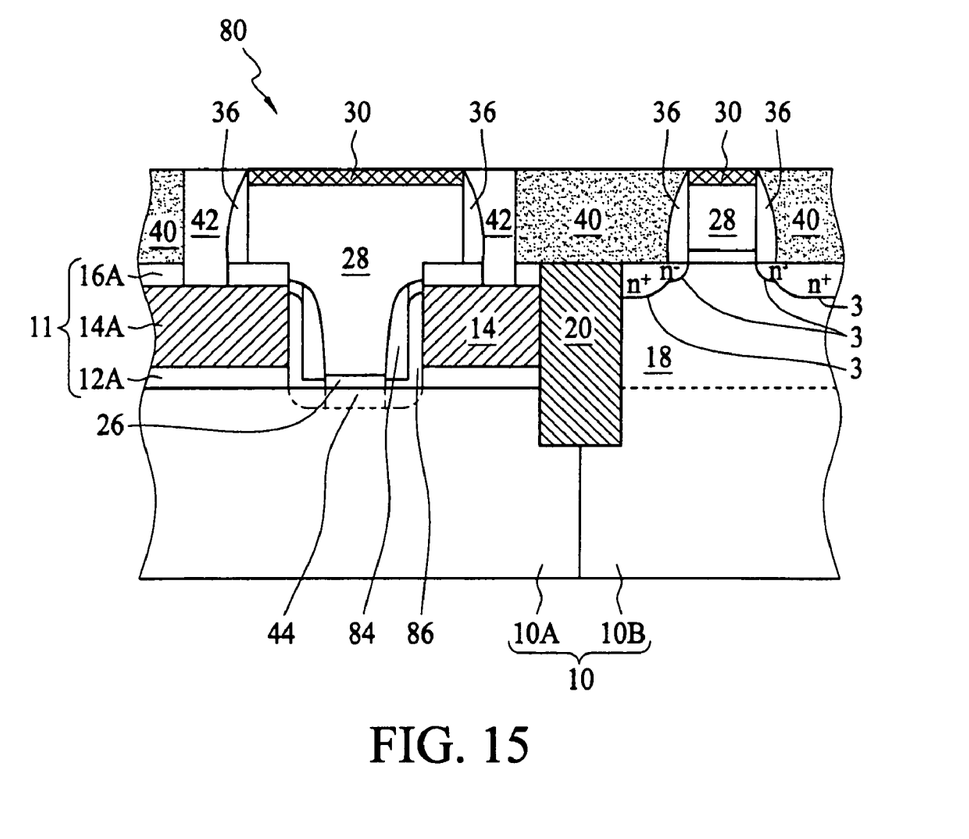

FIG. 13 to FIG. 15 illustrate a method for fabricating a memory cell structure 80 according to another embodiment of the present invention. Compared to the fabrication process of the memory cell structure 40 forming polysilicon spacers 24 on the sidewall of the stack structure 11 (as shown in FIG. 5), the fabrication process of the memory cell structure 80 further includes a step of forming a polysilicon layer 82 on the semiconductor substrate 10 and two dielectric spacers 84 having a conventional spacer shape on the polysilicon layer 82 in the second opening 22, as shown in FIG. 13. An etching process is then performed using the two dielectric spacers 84 as an etching mask to remove a portion of the polysilicon layer 82 uncovered by the two dielectric spacers 84 and above a predetermined height "H" to form two polysilicon spacers 86 having an L-shaped profile on the sidewalls of the two stack structure 11, as shown in FIG. 14. Preferably, a portion of the polysilicon layer above a top end of the dielectric spacer 84 is removed by the etching process so that the top end of the two polysilicon spacers 86 is even with or lower than the bottom surface of the second oxide block 16A. Subsequently, the same fabricating processes shown in FIG. 6 and FIG. 7 are performed to complete the memory cell structure 80, as shown in FIG. 15.

Particularly, the two polysilicon spacers 24 (functional equivalent to the polysilicon spacer 24' and the polysilicon spacer 86) can be made of doped polysilicon or non-doped polysilicon. In the case that the conductive block 14A of the stack structure 11 is made of doped polysilicon, and dopants in the conductive blocks 14A serving as source and drain will diffuse into the polysilicon spacer 24 and the semiconductor substrate 10 in the subsequent thermal process. Preferably, the polysilicon spacer 24 is also made of doped polysilicon. Consequently, the polysilicon block 14A serves as a source and drain region, and the first oxide block 12A can be regarded as a buried isolation between the polysilicon block 14A and the semiconductor substrate 10.

In addition, the polysilicon spacer 24 is used to electrically connect the conductive polysilicon blocks 14A to the channel 44 in the semiconductor substrate 10, and therefore the junction does not exist between the polysilicon block 14A (the source and the drain) and the semiconductor substrate 10 due to isolation of the first oxide block 12A. In other words, the junction is formed only at a small area in the semiconductor substrate 10 right below the polysilicon spacer 24, i.e., the lateral width of the junction of the present invention is substantially the same as the lateral width of the polysilicon spacer 24, which much smaller than the lateral width of the junction consisting of the LDD regions 110 and source/drain 114 in the semiconductor substrate 100 (as shown in FIG. 1), and therefore the junction leakage current can be dramatically reduced.

Further, the short-channel effect depends on the junction depth below the polysilicon spacers 24, and the junction depth further depends on the diffusion of dopants from the polysilicon spacer 24 or the conductive polysilicon block 14A into the semiconductor substrate 10 right below the polysilicon spacer 24. In other words, the junction depth depends on the dopants diffused from the polysilicon spacer 24 or the conductive polysilicon block 14A into the small area in the semiconductor substrate 10 during the subsequent thermal processes. As a result, the junction depth formed by the diffusion of the dopants from the polysilicon spacer 24 is generally very shallow according to the embodiment of the present invention. Conversely, the junction depth in the conventional technology is controlled by both the implanting energy and the diffusion of the implanted dopants, which generally form a deep junction in the semiconductor substrate.

The above-described embodiments of the present invention are intended to be illustrative only. Numerous alternative embodiments may be devised by those skilled in the art without departing from the scope of the following claims.

What is claimed is:

1. A method for fabricating a memory cell structure, comprising steps of:
    forming two stack structures on a semiconductor substrate, wherein each of the stack structures includes a first oxide block, a source/drain block and a second oxide block;
    forming two conductive spacers on sidewalls of the two stack structures;
    forming a gate oxide layer covering a portion of the semiconductor substrate between the two conductive spacers and a carrier channel in a portion of the semiconductor substrate below the gate oxide layer between the two stack structures; and
    forming a gate structure at least on the gate oxide layer.

2. The method for fabricating a memory cell structure of claim 1, wherein the step of forming two conductive spacers on sidewalls of the two stack structures comprises:
    depositing a polysilicon layer on the semiconductor substrate; and
    performing an etching process to remove a portion of the polysilicon layer to form the two conductive spacers.

3. The method for fabricating a memory cell structure of claim 2, wherein the etching process is an anisotropic etching process.

4. The method for fabricating a memory cell structure of claim 1, further comprising a step of forming two dielectric spacers on the two conductive spacers before the step of forming a gate oxide layer.

5. The method for fabricating a memory cell structure of claim 1, wherein the step of forming two conductive spacers on sidewalls of the two stack structures comprises:
    depositing a polysilicon layer on the semiconductor substrate;
    forming a dielectric spacer on the polysilicon layer; and
    removing a portion of the polysilicon layer uncovered by the dielectric spacer to form the two conductive spacers.

6. The method for fabricating a memory cell structure of claim 5, wherein the step of removing a portion of the polysilicon layer is performed by an etching process using the dielectric spacer as an etching mask.

7. The method for fabricating a memory cell structure of claim 1, further comprising a step of forming a recess in the semiconductor substrate between the two conductive spacers before the gate oxide layer is formed.

8. The method for fabricating a memory cell structure of claim 7, wherein the recess is formed by an etching process.

9. The method for fabricating a memory cell structure of claim 1, wherein the step of forming two stack structures on a semiconductor substrate comprises:
    forming a first oxide layer on the semiconductor substrate;
    forming a conductive layer on the first oxide layer;
    forming a second oxide layer on the conductive layer;
    forming a photoresist layer with a first opening on the second oxide layer; and
    performing a first etching process to remove a portion of the second oxide layer, the conductive layer and the first oxide layer to form the two stack structures.

* * * * *